(12) United States Patent
Origasa (10) Patent No.: US 6,768,689 B2
(45) Date of Patent: Jul. 27, 2004

(54) SEMICONDUCTOR MEMORY DEVICE (75) Inventor: Kenichi Origasa, Takatsuki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 175 days.

(21) Appl. No.: 10/428,586

(22) Filed: May 1, 2003

(65) Prior Publication Data
US 2003/0223277 A1 Dec. 4, 2003

(30) Foreign Application Priority Data
May 28, 2002 (JP) ........................................ 2002-154655

(51) Int. Cl.[7] ................................................. G11C 7/00
(52) U.S. Cl. .................................. 365/189.11; 365/226
(58) Field of Search .............................. 365/226, 189.11

(56) References Cited

U.S. PATENT DOCUMENTS

| 4,616,342 A | * 10/1986 | Miyamoto | ............. 365/189.05 |
| 5,822,253 A | 10/1998 | Lines | ..................... 365/189.11 |
| 6,147,914 A | 11/2000 | Leung et al. | .......... 365/189.09 |
| 6,603,328 B2 | * 8/2003 | Takahashi et al. | .......... 324/765 |

FOREIGN PATENT DOCUMENTS

JP          8-63964          3/1996

* cited by examiner

Primary Examiner—Michael Tran
(74) Attorney, Agent, or Firm—Merchant & Gould P.C.

(57) ABSTRACT

The present invention provides a semiconductor memory device whose circuit area is comparatively small and that improves holding characteristics of data in a memory cell. In a word line voltage generator, a voltage Vdd3 of a second power source that is higher than a voltage Vdd of a first power source supplied to the memory cell is applied to a first operational amplifier circuit and a reference voltage generating circuit, and the reference voltage generating circuit generates a voltage that is higher, by a voltage generated through a diode connection of a p-channel transistor, than the voltage proportional to the voltage Vdd as a first reference voltage Vref, and the first operational amplifier circuit outputs a voltage equal to the first reference voltage Vref as a word line drive voltage Vwl. Thus, a leakage current when the memory cell is off can be reduced, without requiring a charge pump circuit or the like.

18 Claims, 11 Drawing Sheets

SEMICONDUCTOR MEMORY DEVICE

BACKGROUND OF THE INVENTION

1. Field of the Invention

The present invention relates to semiconductor memory devices, more particularly, to DRAM (dynamic random access memory) type semiconductor memory devices that allow improved data holding characteristics. The present invention also relates to semiconductor memory devices that are most suitable for combining especially with logic circuits.

2. Description of the Related Art

Figure 14:
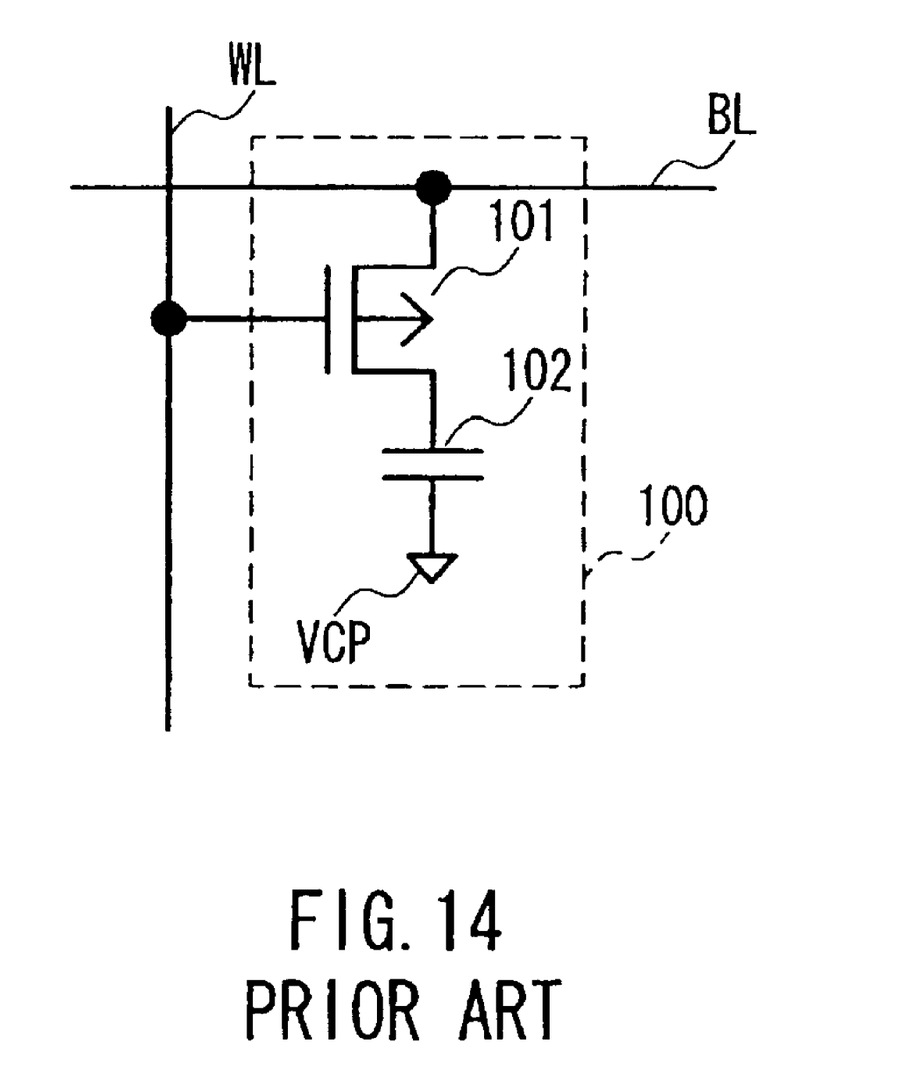
FIG. 14 is a circuit diagram showing the configuration of a memory cell of a conventional DRAM.

FIG. 14 is a circuit diagram showing a configuration of a memory cell of a conventional DRAM (dynamic random access memory). In FIG. 14, numeral 100 denotes a memory cell, WL denotes a word line, BL denotes a bit line, 101 denotes an access transistor, 102 denotes a capacitor, and VCP denotes a cell plate power supply. The memory cell 100 includes one access transistor 101 and one capacitor 102. The drain of the access transistor 101 is connected to one end of the capacitor 102, the gate of the access transistor 101 is connected to the word line WL, the source of the access transistor 101 is connected to the bit line BL, and the other end of the capacitor 102 is connected to the cell plate power supply VCP.

Conventionally, in order to improve holding characteristics of logic data that is stored in the capacitor 102 of the memory cell 100, a configuration has been proposed in which, if the access transistor 101 is made of an n-channel transistor, when the access transistor is off, that is, the word line WL is at low level, a voltage is applied that is lower than a low voltage of a bit line when the bit line BL is activated. Also, a configuration has been proposed in which, if the access transistor 101 is made of a p-channel transistor, when the access transistor 101 is off, that is, the word line WL is at high level, a voltage is applied that is higher than a high voltage of a bit line when the bit line BL is activated (Japanese Laid-Open Patent Publication No. 8-63964).

As a circuit configuration for generating the voltage, a voltage boost circuit according to the charge pumping method generally is proposed (U.S. Pat. No. 6,147,914). Charge pumping allows a voltage higher than an external power source or a voltage lower than a ground potential to be generated, and there is no need for applying those voltages from the outside. Charge pumping is a method for generating a high voltage by periodically switching one node of a capacitor between high level and low level, and supplying the high voltage via a transistor.

In voltage generating circuits according to conventional charge pumping, the current capability can be improved by enlarging the capacitor circuit or by shortening the switching cycle of the capacitor. However, if the capacitor is enlarged, the circuit area is also enlarged, and this causes problems with regard to cost. Further, if the switching cycle is shortened, the circuit area also is enlarged because a drive circuit having a higher capability is required, thereby increasing current consumption.

SUMMARY OF THE INVENTION

Therefore, with the foregoing in mind, it is an object of the present invention to provide a semiconductor memory device whose circuit area is comparatively small and that improves the holding characteristics for data in the memory cell.

In order to achieve the above object, the semiconductor memory according to the present invention includes: a plurality of dynamic random access memory cells each having an access transistor (p-channel transistor) whose drain is connected to a bit line, whose gate is connected to one of a plurality of word lines, and whose source is connected to a capacitive element; a plurality of word line drive circuits that are connected to the plurality of word lines; and a word line voltage generator that is connected to the plurality of word line drive circuits. A first power source (Vdd) that is supplied externally is supplied to a sense amplifier for driving the bit line. The word line voltage generator receives the first power source and a second power source (Vdd3) that is supplied externally, generates a voltage that is by a predetermined voltage closer to a voltage of the second power source than the voltage of the first power source, and supplies the generated voltage to the plurality of word line drive circuits as a word line drive voltage (Vwl).

According to this characteristic configuration, an optimum off voltage of the word line that allows minimizing of a leakage current can be supplied as a voltage that is supplied to the plurality of dynamic random access memory cells, and a semiconductor memory device having a comparatively small circuit area without the requirement for a charge pump circuit or the like can be achieved by stepping-down the voltage of the second power source.

In the semiconductor memory device according to the present invention, it is preferable that the word line voltage generator includes: a first comparator (a first operational amplifier circuit) for comparing the word line drive voltage (Vwl) that is supplied to the word line drive circuit with a first reference voltage (Vref), and controlling conduction between a signal line of the word line drive voltage and the second power source (Vdd3); a first reference voltage generating circuit (Vdd reference load) for generating a voltage proportional to the voltage of the first power source (Vdd) as a second reference voltage (Vdl); a second reference voltage generating circuit (offset load) for generating a third reference voltage (Vpoi) from a second node that is connected through a transistor that is diode-connected to a first node to which the first reference voltage is applied; and a second comparator (a second operational amplifier circuit) for determining the first reference voltage by comparing the second reference voltage (Vdl) and the third reference voltage (Vpoi).

In this case, the voltage of the first power source has positive polarity, and the voltage of the second power source (for example, 3.3V) is higher than the voltage of the first power source (for example, 1.5 V), and the word line drive voltage (Vwl) is approximately 0.4 V higher than the voltage of the first power source (Vdd), or it is higher, by a voltage generated through a diode connection of a p-channel transistor having an identical configuration to the access transistor, than a voltage proportional to the voltage of the first power source.

In addition, it is preferable that the first reference voltage generating circuit (Vdd reference load) generates a second reference voltage (Vdl) by resistively dividing a voltage between the first power source (Vdd) and ground, and the second reference voltage generating circuit (offset load) includes: a first resistive element that is connected in series with a transistor that is diode-connected between the first node and the second node; and a second resistive element that is connected between the second node and the ground, and generates the third reference voltage (Vpoi) based on a voltage that is generated across the second resistive element.

With the word line voltage generator having a configuration mentioned above, the voltage Vdd3 of the second power source, which is higher than the voltage Vdd of the first power source that is supplied to the memory cells, is supplied to first and second comparators. The first and the second reference voltage generators and the second comparator (collectively referred to as "reference voltage generating circuit") generate a voltage that is higher, by a voltage generated through a diode connection of the p-channel transistor, than a voltage proportional to the voltage Vdd of the external power source as the first reference voltage (Vref), and the first comparator outputs a voltage that is equal to the first reference voltage Vref as a word line drive voltage Vwl, so that in a wide range of external voltages Vdd, a channel leakage current when the memory cell is off can be reduced most efficiently. Thus, there is no need for generating a voltage boost power source by providing a charge pump circuit, and a semiconductor memory device having a comparatively small circuit area can be achieved.

In addition, it is preferable that the semiconductor memory device is formed with a logic circuit and an analog circuit on a single semiconductor chip, the semiconductor chip includes a plurality of input/output portions (I/O) that are used for connection with the outside, and a power source that is supplied to the plurality of I/Os and the analog circuit is shared with the second power source.

According to this configuration, the number of the power sources that are supplied to the semiconductor chip can be reduced.

Further, in the semiconductor memory device according to the present invention, it is preferable that the film thickness of a gate oxide film of transistors that constitute the first and the second comparators to which a high voltage (Vdd3) is supplied is larger than that of a gate oxide film of the access transistor to which a lower voltage (Vdd) is supplied, so that reliability of the gate oxide film of the transistors that constitute the first and the second comparators can be ensured.

Further, in the semiconductor device according to the present invention, it is preferable that the film thickness of the gate oxide film of the transistors that constitute the first and the second comparators to which a high voltage (Vdd3) is supplied is larger than that of the gate oxide film of the access transistor to which a lower voltage (Vdd) is supplied, and the gate oxide film of the transistors that constitute the first and the second comparators is manufactured in the same manufacturing step as a gate oxide film of transistors that constitute the plurality of I/Os and the analog circuit to which a high voltage (Vdd3) is supplied. Thus, the reliability of the gate oxide film of the transistors that constitute the first and the second comparators, the plurality of I/Os, and the analog circuit can be ensured, and manufacturing cost can be kept down.

Further, in the semiconductor memory device according to the present invention, it is preferable that a gate oxide film of transistors that constitute the plurality of word line drive circuits to which a high voltage (Vdd3) is supplied is manufactured in the same manufacturing step as the gate oxide film of the transistors that constitute the first and the second comparators to which a high voltage (Vdd3) is also supplied. Thus, the reliability of the gate oxide film of the transistors that constitute the plurality of word line drive circuits can be ensured.

Further, in the semiconductor memory device according to the present invention, it is preferable that the gate oxide film of the transistors that constitute the plurality of word line drive circuits to which a high voltage (Vwl) is supplied is manufactured in the same manufacturing step as the gate oxide film of the transistors that constitute the first and the second comparators to which a high voltage (Vdd3) is also supplied and the gate oxide film of the transistors that constitute the plurality of I/Os and the analog circuit. Thus, the reliability of the gate oxide film of the transistors that constitute the plurality of word line drive circuits can be ensured, and manufacturing cost can be kept down.

Further, in the semiconductor memory device according to the present invention, it is preferable that a capacitive element of the plurality of dynamic random access memory cells is made of second p-channel transistors, and that the semiconductor memory device according to the present invention is manufactured by a general logic process, so that the semiconductor memory device according to the present invention can be achieved without increasing manufacturing cost.

Further, in the semiconductor memory device according to the present invention, it is preferable that the word line voltage generator generates a voltage obtained by adding a first offset voltage to the voltage of the first power source when a control signal (burn-in signal NBI) that is input is at a first voltage level (high level) (during normal operation), and generates a voltage obtained by adding a second offset voltage that is lower than the first offset voltage to a voltage of the first power source when the control signal is at a second voltage level (low level) (when a burn-in test is conducted).

This configuration allows lowering of a first reference voltage Vref, that is, an off voltage of the word line WL when the burn-in test is conducted, and allows unnecessarily high voltage from being applied to the word line WL to be prevented, even if a high voltage is applied as an external power source Vdd.

DESCRIPTION OF THE PREFERRED EMBODIMENTS

Hereinafter, preferable embodiments of the present invention will be described with reference to the drawings.

First Embodiment

Figure 1:
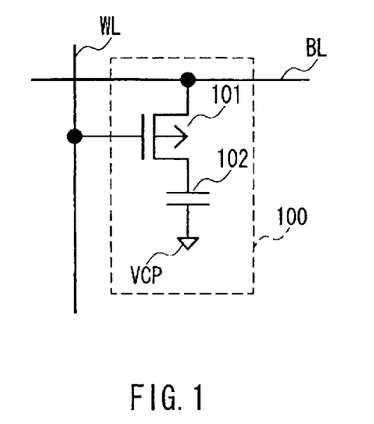
FIG. 1 is a circuit diagram showing the configuration of a memory cell of the semiconductor memory device according to a first embodiment of the present invention.

FIG. 1 is a circuit diagram showing the configuration of a memory cell of a semiconductor memory device according to a first embodiment of the present invention. In FIG. 1, numeral 100 denotes a memory cell, WL denotes a word line, BL denotes a bit line, 101 denotes an access transistor, 102 denotes a capacitor (capacitive element), and VCP denotes a cell plate power source. This configuration is the same as the conventional configuration. The access transistor 101 is made of a p-channel transistor. As the gate oxide film of the access transistor 101, a gate oxide film having thin film thickness (1.9 nm to 3.0 nm) is used. The capacitor 102 may have a configuration in which an insulating film is sandwiched by electric conductors, or the gate capacitance of a MOS transistor may be used. In this case, as the gate oxide film of the MOS transistor, a gate oxide film having a slightly thicker film thickness (2.4 nm to 5.0 nm) is used to limit a leakage current that passes through the gate. When the leakage current does not cause any problems, the same film thickness as that of the gate oxide film of the access transistor 101 (that is, a film thickness that can be manufactured in the same manufacturing process) may be used. When the gate capacitance of the MOS transistor is used as the capacitor 102, the manufacturing process can be simplified by employing a manufacturing process similar to that of the access transistor 101, and the semiconductor memory device according to the present embodiment can be achieved by a general logic process.

Figure 2:
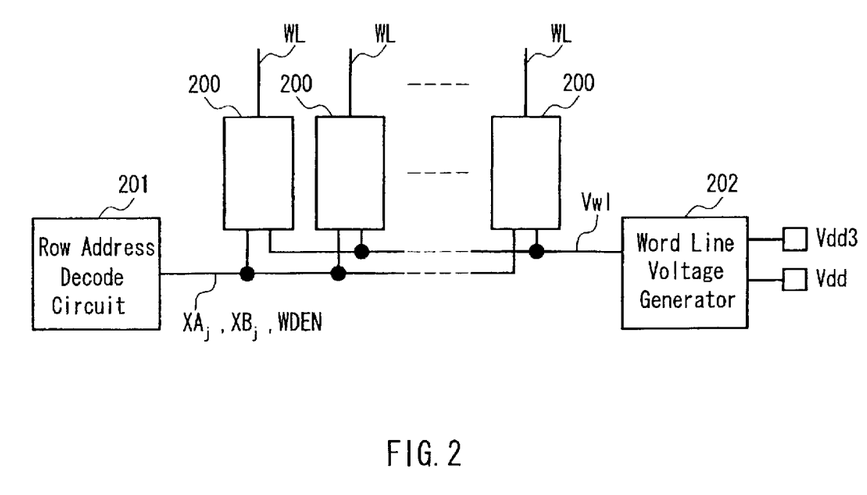
FIG. 2 is a block diagram showing the configuration of the word line drive circuit system of the semiconductor memory device according to the first embodiment of the present invention.

FIG. 2 is a block diagram showing the configuration of the word line drive circuit system of the semiconductor memory device according to the present embodiment. In FIG. 2, numeral 200 denotes word line drive circuits, 201 denotes a row address decode circuit, 202 denotes a word line voltage generator, Vwl denotes a word line drive voltage, XAj and XBj denote row address decode signals, WDEN denotes a word line drive timing signal, and Vdd and Vdd 3 denote external power sources.

The external power source Vdd, which is a first power source, is a power source having a low voltage (for example, 1.5 V) that is electrically connected to a logic (logic circuit) such as a peripheral control circuit other than the array in which the memory cells 100 are disposed in a matrix, and to a sense amplifier that is used when the bit lines BL inside the memory core are activated. The external power source Vdd3, which is a second power source, is a power source having a high voltage (for example, 3.3 V) that is supplied to an I/O portion for connecting the silicon chip on which the semiconductor device according to the present embodiment is mounted with the outside, and to an analog block (phase-locked loop (PLL) circuit, digital/analog converter (DAC), analog/digital converter (ADC), and the like) that is mounted simultaneously on the silicon chip.

A predetermined number (for example, 1024) of word line drive circuits 200 are arranged in a line, each driving different word lines WL. A plurality of row address decode signals XAj (for example, j=0 to 63) and XBj (for example, j=0 to 15) are output from the row address decode circuit 201. Also, a word line drive timing signal WDEN is output from the row address decode circuit 201. The plurality of row address signals XAj and XBj are supplied to the word line drive circuits 200 one by one in a predetermined combination. Also, the word line drive timing signal WDEN is supplied to the word line drive circuits 200.

The word line voltage generator 202 receives the supply from the external power sources Vdd and Vdd3 and outputs a word line drive voltage Vwl. The word line drive voltage Vwl is supplied evenly to the word line drive circuits 200.

Figure 3:
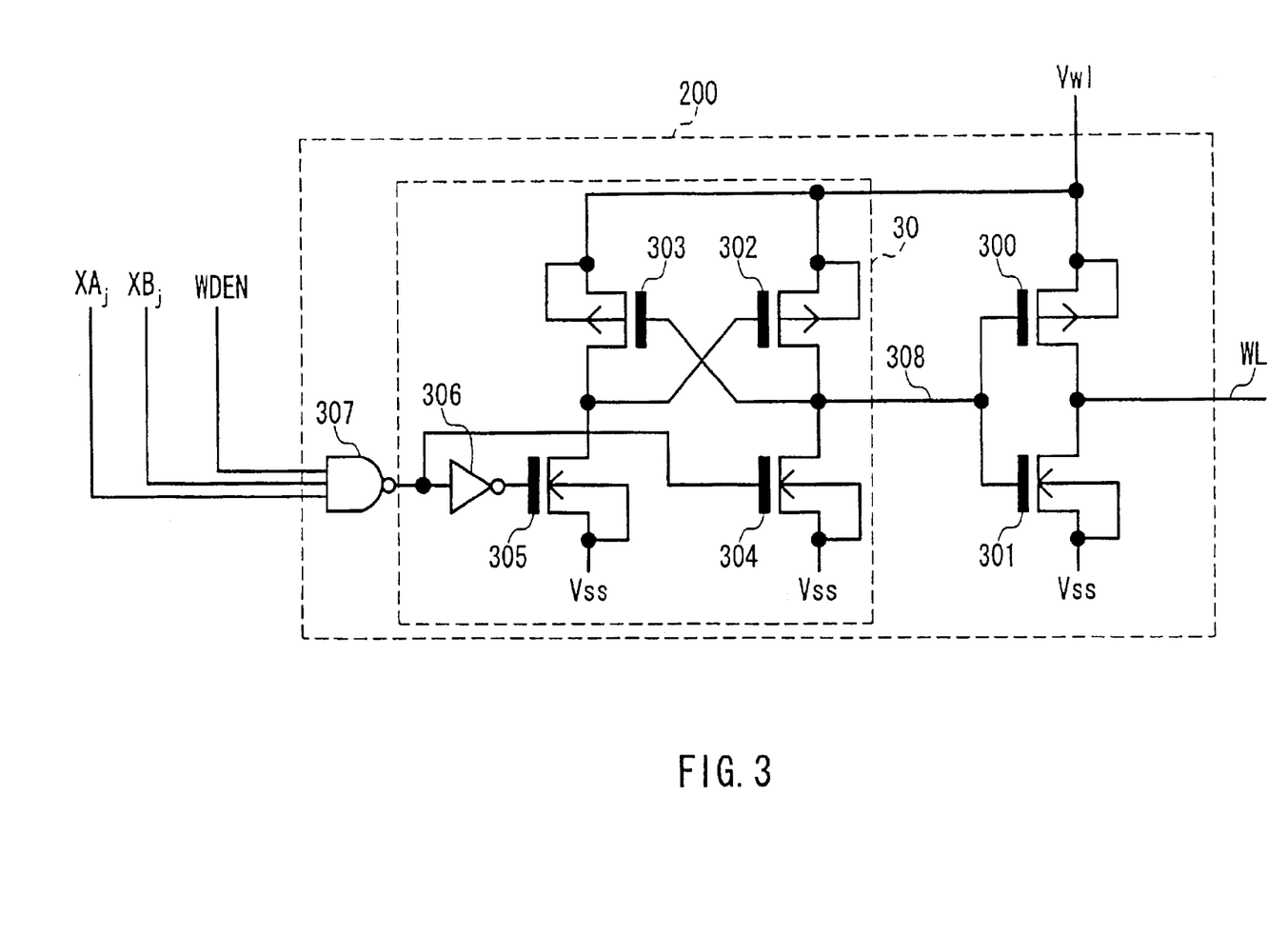
FIG. 3 is a circuit diagram showing the internal configuration of the word line drive circuit 200 in FIG. 2.

FIG. 3 is a circuit diagram showing the internal configuration of the word line drive circuits 200 in FIG. 2. In FIG. 3, numeral 30 denotes a level shifter, 300, 302 and 303 denote p-channel transistors, 301, 304 and 305 denote n-channel transistors, 306 denotes a first inverter, 307 denotes a 3-input NAND gate, 308 denotes a level shifter output node, and Vss denotes a ground potential.

As mentioned above, the predetermined row address decode signals XAj, XBj and the word line drive timing signal WDEN are supplied to the word line drive circuits 200 one by one. The row address decode signals XAj, XBj and the word line drive timing signal WDEN are input to the 3-input NAND gate 307, and the output signal of the 3-input NAND gate 307 is input to the level shifter 30.

The level shifter 30 is made of the p-channel transistors 302 and 303, the n-channel transistors 304 and 305, and the first inverter 306. The word line drive voltage Vwl is supplied to the sources and the substrates of the p-channel transistors 302 and 303, and the drain of the p-channel transistor 302 and the gate of the p-channel transistor 303 are connected to the level shifter output node 308. The drain of the p-channel transistor 303 is connected to the gate of the p-channel transistor 302. The sources and the substrates of the n-channel transistors 304 and 305 are connected to the ground potential Vss. The drain of the n-channel transistor 304 is connected to the level shifter output node 308, and the gate of the n-channel transistor 304 is connected to the output terminal of the 3-input NAND gate 307. Further, the drain of the n-channel transistor 305 is connected to the drain of the p-channel transistor 303, and the gate of the n-channel transistor 305 is connected to the output terminal of the first inverter 306.

The drain of the p-channel transistor 300 used for resetting the word line is connected to the word line WL. The word line drive voltage Vwl is supplied to the source and substrate of the p-channel transistor 300. Further, the drain of the n-channel transistor 301 used for activating the word line is connected to the word line WL. The source and the substrate of the n-channel transistor 301 are connected to the ground potential Vss. The gates of the p-channel transistor 300 and the n-channel transistor 301 are connected to the level shifter output node 308.

In order to prevent the electric charge that is accumulated in the capacitor 102 (FIG. 1) from leaking through the access transistor 101 (FIG. 1), the word line drive voltage Vwl that is applied to the word line WL is higher than the voltage applied to the bit line. Therefore, the gate oxide films used in the p-channel transistors 300, 302 and 303, and n-channel transistors 301, 304 and 305, to which the word line drive voltage Vwl is supplied, are thicker (3.0 nm to 7.5 nm) than that used in the access transistor 101 that is part of the memory cell. This gate oxide film may be manufactured at the same time as a gate oxide film of transistors used in the I/O portion that connects the silicon chip, on which the semiconductor memory device according to the present embodiment is mounted, with the outside, or a gate oxide film of transistors used in an analog block (PLL circuit, DAC, ADC, and the like) that is simultaneously mounted on the silicon chip and to which ordinarily a high voltage is applied, thereby restraining cost increase.

Figure 4:
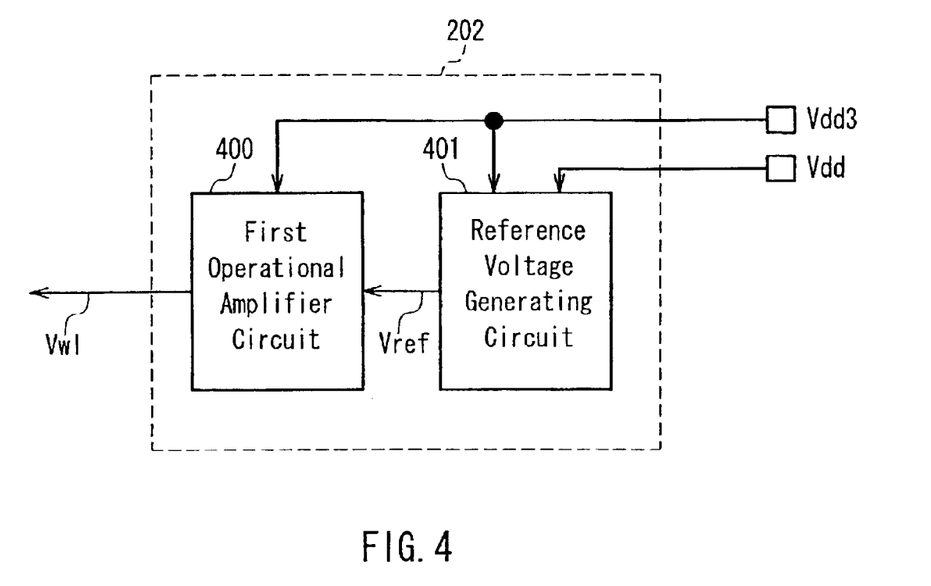
FIG. 4 is a circuit diagram showing the internal configuration of the word line voltage generator 202 in FIG. 2.

FIG. 4 is a circuit diagram showing the internal configuration of the word line voltage generator 202 in FIG. 2. In FIG. 4, numeral 400 denotes a first operational amplifier circuit serving as a first comparator circuit, 401 denotes a reference voltage generating circuit, and Vref is a first reference voltage. The external power source Vdd3 is supplied to the first operational amplifier circuit 400, and the external power source Vdd and the external power source Vdd3 are supplied to the reference voltage generating circuit 401. The reference voltage generating circuit 401 generates a first reference voltage Vref, and the first reference voltage Vref is input to the first operational amplifier circuit 400.

Figure 5:
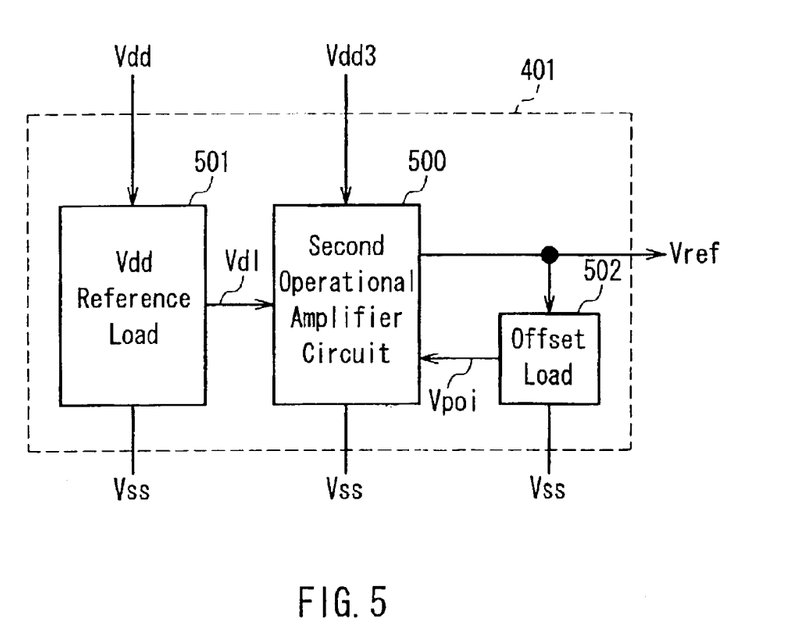
FIG. 5 is a block diagram showing an internal configuration of the reference voltage generating circuit 401 in FIG. 4.

FIG. 5 is a circuit diagram showing the internal configuration of the reference voltage generating circuit 401 in FIG. 4. In FIG. 5, numeral 500 denotes a second operational amplifier circuit serving as a second comparator, 501 denotes a Vdd reference load serving as a first reference voltage generating circuit, 502 denotes an offset load serving as a second reference voltage generating circuit, Vdl denotes a second reference voltage, and Vpoi denotes a third reference voltage. The external power source Vdd is supplied to the Vdd reference load 501, and a second reference voltage Vdl is output from the Vdd reference load 501. The first reference voltage Vref is supplied to the offset load 502, and a third reference voltage Vpoi is output from the offset load 502. The second operational amplifier circuit 500 outputs the first reference voltage Vref, and the second reference voltage Vdl and the third reference voltage Vpoi are input to the second operational amplifier circuit 500.

Figure 6:
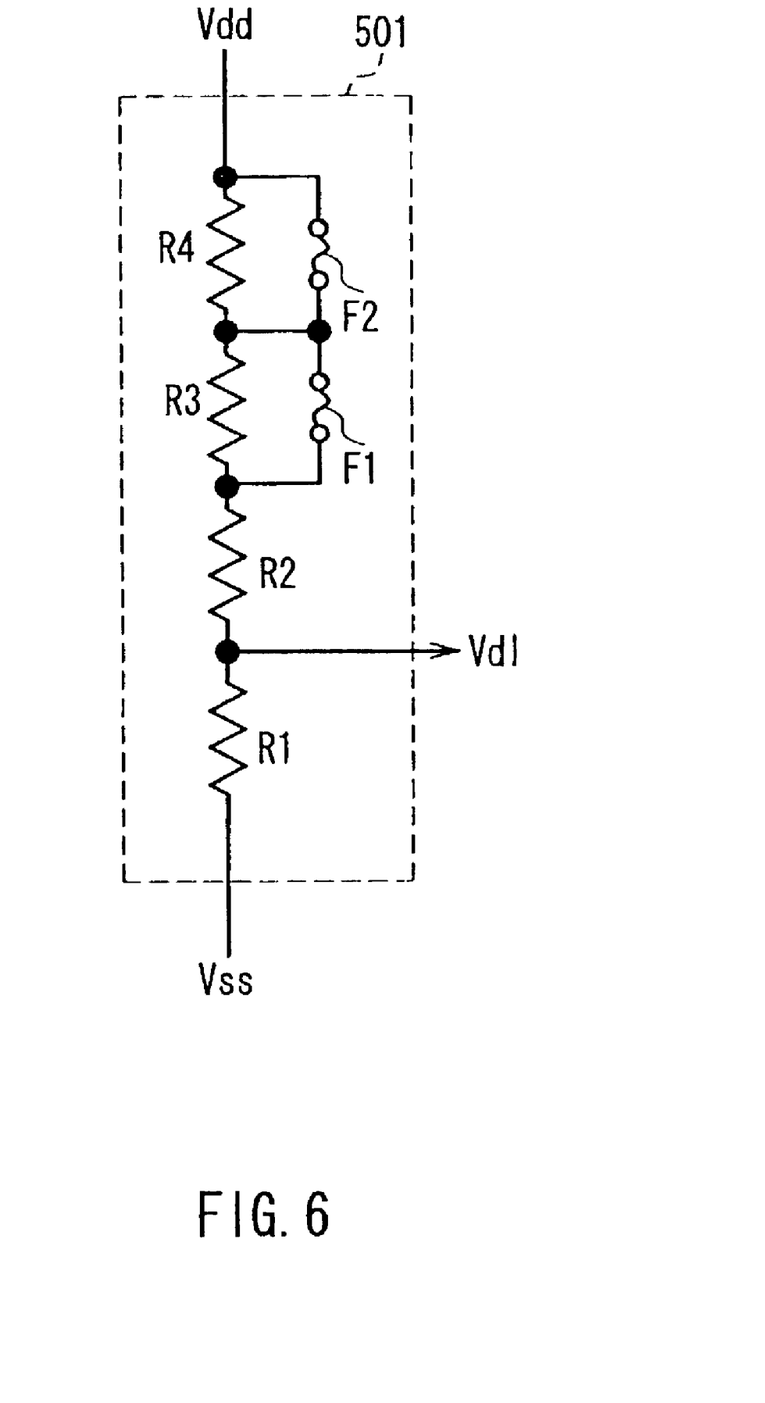
FIG. 6 is a circuit diagram showing the internal configuration of the Vdd reference load 501 in FIG. 5.

FIG. 6 is a circuit diagram showing the configuration of the Vdd reference load 501 in FIG. 5. In FIG. 6, R1 to R4 are resistive elements, and F1 and F2 are fuse elements. The resistive elements R1 to R4 are connected in series in order of increasing element number. One end of the resistive element R1 is connected to the ground potential Vss, and one end of the resistive element R4 is connected to the external power source Vdd. The above mentioned second reference voltage Vdl is output from the node at which the resistive element R1 and the resistive element R2 are connected. For the resistive elements R1 to R4, resistive elements having high resistance values (up to several 10 kΩ) are selected in order generally to limit current consumption, and non-salicided polysilicon or a diffusion layer may be used as a resistor. The fuse element F1 is connected in parallel with the resistive element R3, and the fuse element F2 is connected in parallel with the resistive element R4. In FIG. 6, two resistive elements connected in series are connected in parallel with the fuse elements. However, it is also possible to connect three or more resistive elements in series, further increasing the number of divisions of the resistance.

Figure 7:
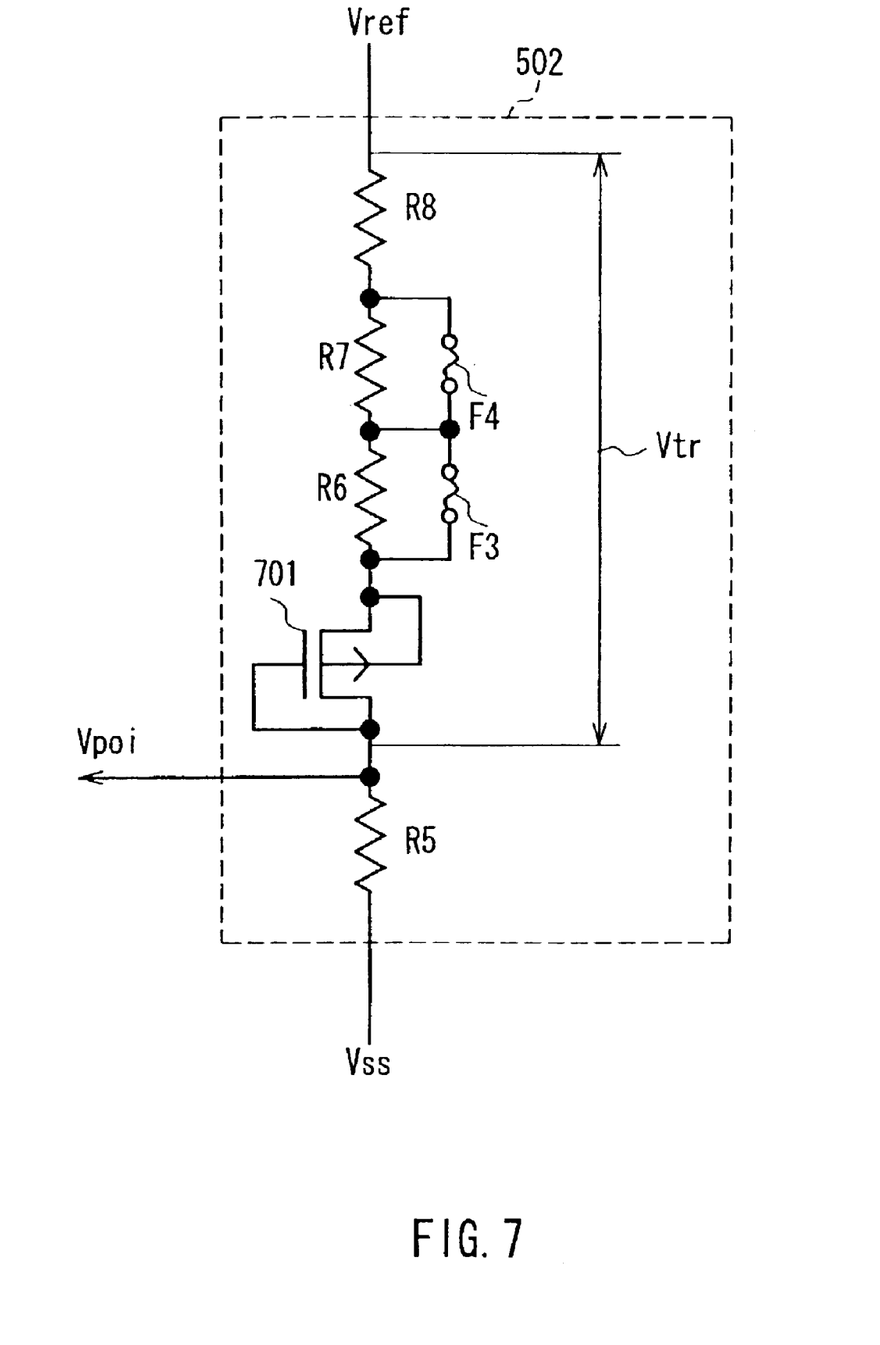
FIG. 7 is a circuit diagram showing the internal configuration of the offset load 502 in FIG. 5.

FIG. 7 is a circuit diagram showing the configuration of the offset load 502 in FIG. 5. In FIG. 7, R5 to R8 are resistive elements, and F3 and F4 are fuse elements. Numeral 701 denotes a p-channel transistor in a diode connection. One end of the resistive element R5 is connected to the ground potential Vss. The other end of the resistive element R5 is connected to the gate and the drain of the p-channel transistor 701, and a third reference voltage Vpoi is output therefrom. The substrate and the source of the p-channel transistor 701 are connected to one end of the resistive element R6. The film thickness of the gate oxide film of the p-channel transistor 701 is equal to that of the gate oxide film of the access transistor 101 (FIG. 1). The other end of the resistive element R6 is connected to one end of the resistive element R7, and the other end of the resistive element R7 is connected to one end of the resistive element R8. The fuse element F3 is connected in parallel with the resistive element R6, and the fuse element F4 is connected in parallel with the resistive element R7. The first reference voltage Vref is supplied to the other end of the resistive element R8. For the resistive elements R5 to R8, resistive elements having high resistance values (up to several 10 kΩ) are selected in order to generally limit current consumption, and a non-salicided polysilicon or a diffusion layer may be used as a resistor. In FIG. 7, two resistive elements connected in series are connected in parallel with the fuse elements. However, it is also possible to connect three or more resistive elements in series, further increasing the number of divisions of the resistance.

Figure 8:
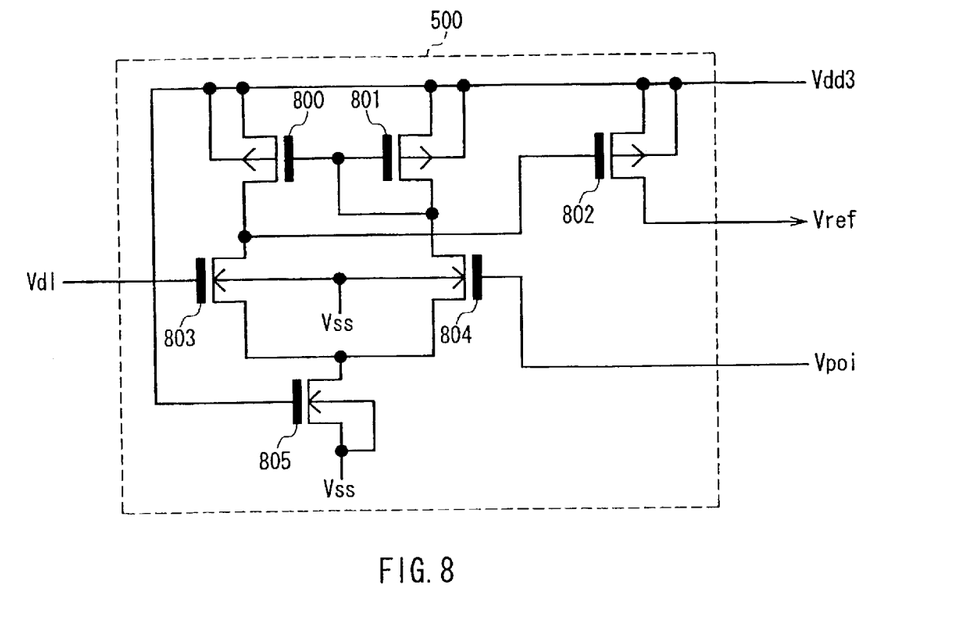
FIG. 8 is a circuit diagram showing the internal configuration of the second operational amplifier circuit 500 in FIG. 5.

FIG. 8 is a circuit diagram showing the internal configuration of the second operational amplifier circuit 500 in FIG. 5. The second operational amplifier circuit 500 is a commonly used differential operational amplifier. In FIG. 8, numerals 800, 801 and 802 denote p-channel transistors, and 803, 804 and 805 denote n-channel transistors. The gate oxide films of these transistors are thicker (3.0 nm to 7.5 nm) than that of the access transistor 101 (FIG. 1) that constitutes the memory cell. The p-channel transistors 800 and 801 form a current mirror, and their drains are connected to the drains of the n-channel transistors 803 and 804. The external power source Vdd3 is supplied to the sources of the p-channel transistors 800 and 801. The sources of the n-channel transistors 803 and 804 are connected to the drain of the n-channel transistor 805, the source of the n-channel transistor 805 is connected to the ground potential Vss, and the external power source Vdd3 is supplied to the gate of the n-channel transistor 805. The second reference voltage Vdl is supplied to the gate of the n-channel transistor 803, and the third reference voltage Vpoi is supplied to the gate of the n-channel transistor 804. In the p-channel transistor 802, the drain of the n-channel transistor 803 is connected to the gate, the external power source Vdd3 is supplied to the source, and the reference voltage Vref is output from the drain.

Figure 9:
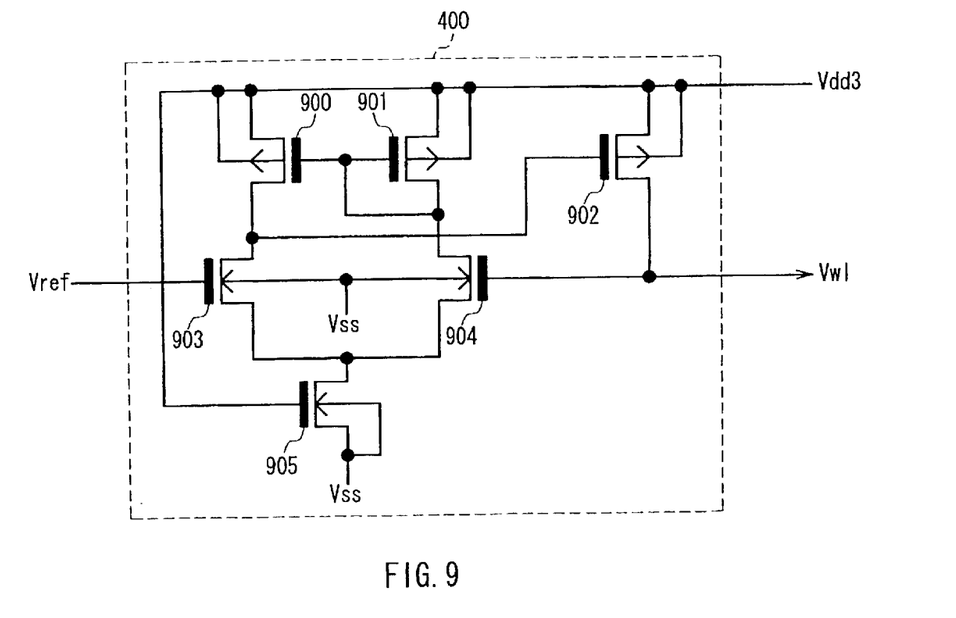
FIG. 9 is a circuit diagram showing the internal configuration of the first operational amplifier circuit 400 in FIG. 4.

FIG. 9 is a circuit diagram showing the internal configuration of the first operational amplifier circuit 400 in FIG. 4. The first operational amplifier circuit 400 is a commonly used differential operational amplifier. In FIG. 9, numerals 900, 901 and 902 denote p-channel transistors, and 903, 904 and 905 denote n-channel transistors. The gate oxide films of these transistors are thicker (3.0 nm to 7.5 nm) than that of the access transistor 101 (FIG. 1) that constitutes the memory cell. The p-channel transistors 900 and 901 form a current mirror, and their drains are connected to the drains of the n-channel transistors 903 and 904. The external power source Vdd3 is supplied to the sources of the p-channel transistors 900 and 901. The sources of the n-channel transistors 903 and 904 are connected to the drain of the n-channel transistor 905, the source of the n-channel transistor 905 is connected to the ground potential Vss, and the external power source Vdd3 is supplied to the gate of the n-channel transistor 905. The first reference voltage Vref is supplied to the gate of the n-channel transistor 903, and the word line voltage VWL is supplied to the gate of the n-channel transistor 904. In the p-channel transistor 902, the drain of the n-channel transistor 903 is connected to the gate, the external power source Vdd3 is supplied to the source, and the word line voltage VWL is output from the drain.

Next, the operation of the semiconductor memory device having a configuration as explained above will be described.

Figure 10:
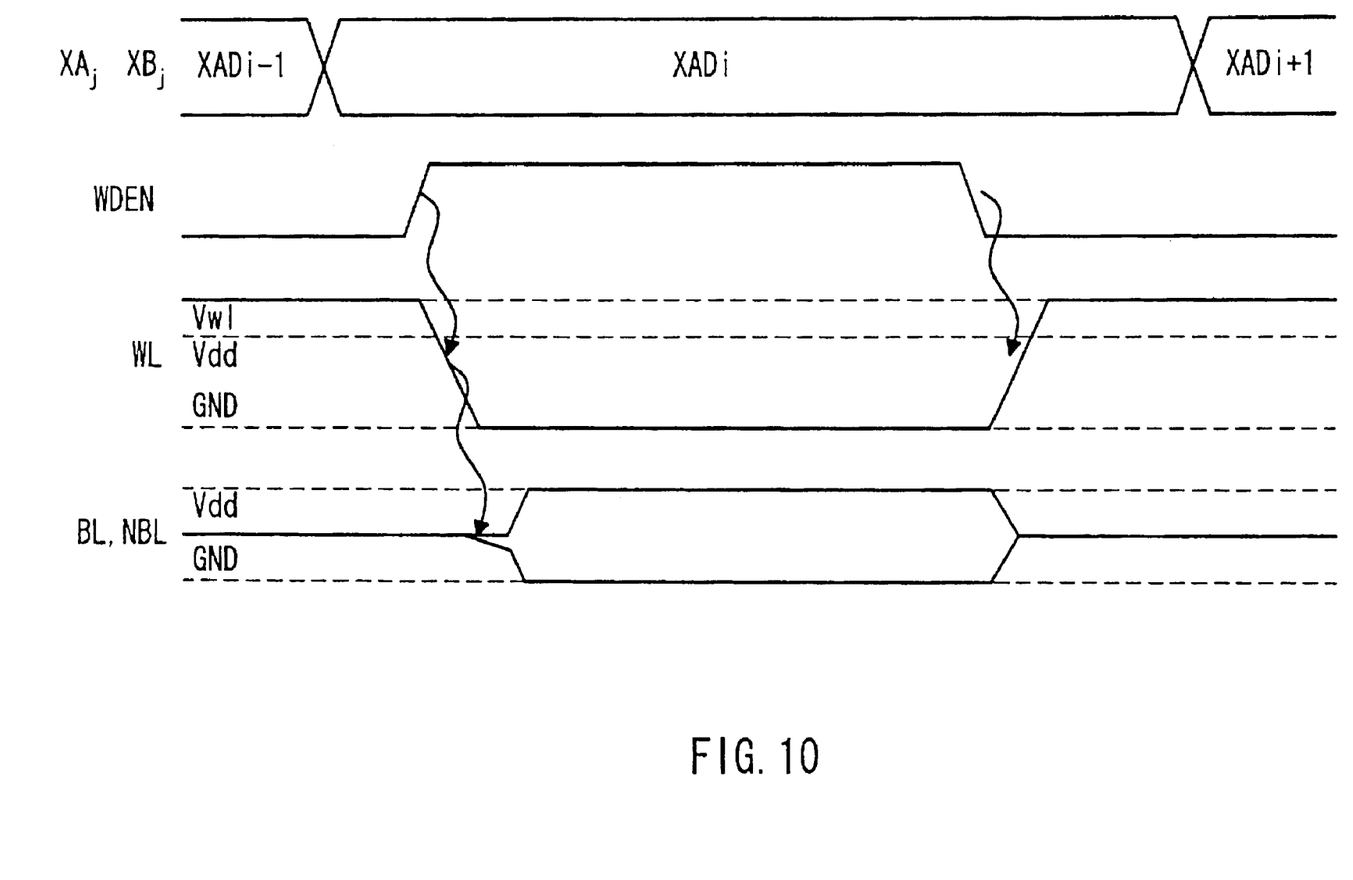
FIG. 10 is a diagram showing the timing of the operation and the potential of the memory array portion.

FIG. 10 is a diagram showing the timing of the operation and the potential of the memory array portion. NBL denotes a complementary bit line that pairs up with the bit line BL. The row address decode circuit 201 decodes an external row address and sets one of the row address decode signals XAj and one of the row address decode signals XBj to a high level. Then, the row address decode circuit 201 sets the word line drive timing signal WDEN to high level at a predetermined timing. In the word line drive circuit 200 to which ones with high level of row address decode signals XAj and XBj are supplied, the output signal of the 3-input NAND gate 307 becomes low level. In all other word line drive circuits 200, the output signal of the 3-input NAND gate 307 remains at high level.

When the output signal of the 3-input NAND gate 307 is at high level, the n-channel transistor 304 is turned on, the level shifter output node 308 assumes the ground potential Vss, the p-channel transistor 300 is turned on, and the n-channel transistor 301 is turned off. In this case, the word line drive voltage Vwl is applied to the word line WL.

On the other hand, when the output signal of the 3-input NAND gate 307 becomes low level, the output signal of the first inverter 306 becomes high level, and the n-channel transistor 305 is turned on. Further, the n-channel transistor 304 is turned off, and as a result the word line drive voltage Vwl is applied to the level shifter output node 308. Thus, the p-channel transistor 300 is turned off, and the n-channel transistor 301 is turned on. That is to say, the word line WL assumes the ground potential Vss.

When the word line WL is set to be the ground potential Vss, a plurality of transistors 101 connected to the word line WL are turned on, and a charge accumulated in a capacitor 102 is read out to the bit line BL. The charge read out to the bit line BL is amplified by a sense amplifier or the like as in the operation of a common DRAM. The high level of the bit line BL and the complementary bit line NBL is charged to the external power source Vdd, and the low level thereof is discharged to the ground potential Vss.

When the word line drive voltage Vwl is applied to the word line WL, the word line drive voltage Vwl is applied to the gates of the plurality of access transistors 101 that are connected to the word line WL. The word line drive voltage Vwl is higher by a predetermined voltage than the voltage of the external power source Vdd, which is the high level of the bit line BL. Thus, channel leakage of the access transistors 101 can be reduced to approximately one hundredth, compared with the case in which the external power source Vdd is applied to the gates of the plurality of access transistors 101.

The following is a description of how the word line voltage generator 202 generates the word line drive voltage Vwl.

Figure 11:
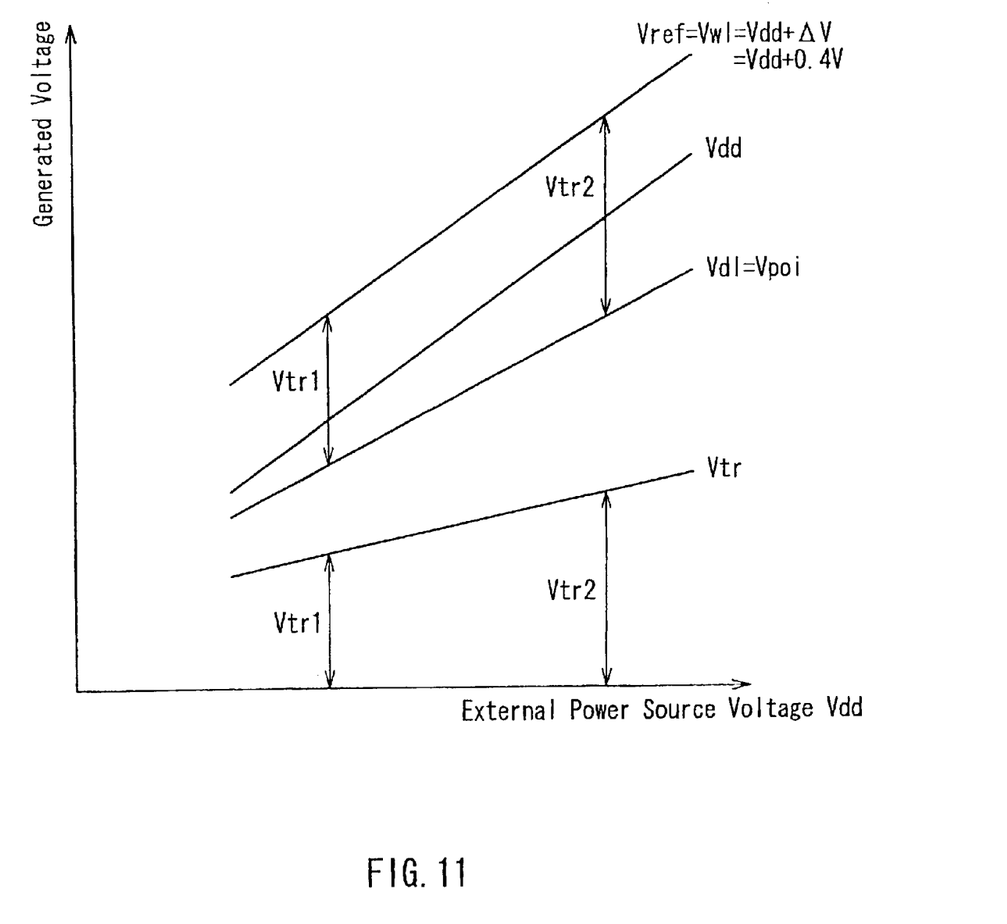
FIG. 11 is a graph showing the dependency of each main voltage on the external voltage Vdd.

FIG. 11 is a graph showing the dependency of each main voltage on the external power source voltage Vdd. In the Vdd reference load 501, when the resistance values of the resistive elements R1 and R2 are r1 and r2, the second reference voltage Vdl becomes r2×Vdd/(r1+r2), resulting in a voltage that is proportional to the external power source Vdd. The second operational amplifier circuit 500 generates the first reference voltage Vref so that the third reference voltage Vpoi becomes equal to the second reference voltage Vdl. In the offset load 502, when the resistance value of the resistive element R5 is r5, a current of (r2×Vdd/(r1+r2))/r5=i (R5) flows through the resistive element R5. A voltage determined by current i (r5) is generated as the voltage Vtr in FIG. 7.

Figure 12:
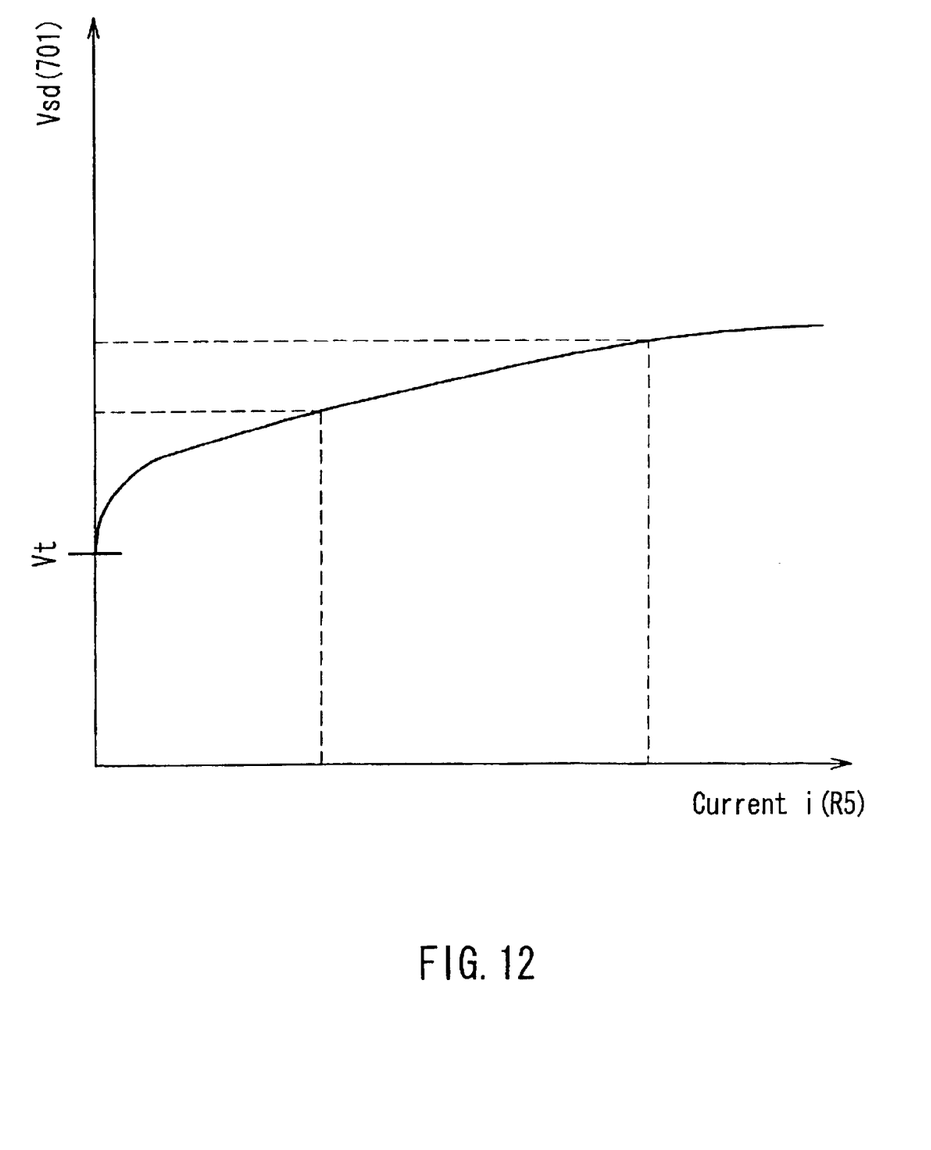
FIG. 12 is a graph showing a relationship between the current i (R5) between the source and the drain, and voltage Vsd (701) between the source and the drain, of the p-channel transistor 701 in FIG. 7.

FIG. 12 is a graph showing the relationship between the current (i (r5)) between the source and the drain of the p-channel transistor 701, and the voltage Vsd (701) between the source and the drain of the p-channel transistor 701 of the offset load 502. The p-channel transistor 701 is diode-connected, so that the generated voltage Vsd (701) between the source and the drain becomes a voltage close to the threshold voltage (Vt) of the p-channel transistor 701, and the generated voltage increases nearly linearly with respect to the current i (R5). Therefore, the current i (R5) that flows in the p-channel transistor 701 increases linearly in accordance with the external power source Vdd, and the voltage Vtr in FIG. 7 becomes a voltage that increases nearly linearly from the threshold voltage (Vt) of the p-channel transistor 701, as shown in FIG. 11. Thus, the first reference voltage Vref becomes a voltage of Vpoi (=Vdl)+Vtr.

By appropriately selecting the sum of the gradient of the voltage Vsd (701) between the source and the drain with respect to the external power source Vdd in the p-channel transistor 701 and the gradient of the generated voltage at the resistive element R8, and the gradient of the second reference voltage Vdl with respect to the external power source Vdd, a voltage of the external power source Vdd+ΔV (for example, ΔV=0.4V) can be generated as the first reference voltage Vref. Thus, that a voltage higher than the external power source Vdd can be generated as the first reference voltage Vref is due to supplying the external power source Vdd3 (the voltage higher than the external power source Vdd) to the second operational amplifier circuit 500.

The first operational amplifier circuit 400 receives the first reference voltage Vref and outputs the word line drive voltage Vwl, which is the same voltage as the first reference voltage Vref The external power source Vdd3(with a voltage that is higher than the external power source Vdd) is also supplied to the first operational amplifier circuit 400, and a current is supplied to the word line WL through the p-channel transistor 902. A transistor size having a current supply capability that is sufficient to drive the word line WL is employed for the p-channel transistor 902.

As described above, according to the present embodiment, the external power source Vdd3 is supplied to the first operational amplifier circuit 400 and the reference voltage generating circuit 401, so that a word line voltage generator 202 having a small circuit area can be provided, without requiring a charge pump circuit or the like. By sharing this external power source Vdd3 with a power source having a high voltage (for example, 3.3 V) that is supplied to the I/O portion, which connects the silicon chip on which the semiconductor memory device according to the present embodiment is mounted to the outside, and to an analog block (PLL circuit, DAC, ADC, and the like), which is simultaneously mounted on the silicon chip, it is possible to reduce the number of power source terminals.

In addition, the reference voltage generating circuit 401 generates a voltage that is higher, by a voltage that is generated by a diode connection of the p-channel transistor 701, than the voltage proportional to the external power source Vdd. Thus, the dependency of the generated voltage of the p-channel transistor 701 on the external power source Vdd is canceled, a voltage of Vdd+ΔV can be generated as a voltage when the word line WL is off, and a channel leakage current when the memory cell is off can be reduced most efficiently over a wide range of external power source voltages Vdd.

In addition, transistors used in the first operational amplifier circuit 400 and the second operational amplifier circuit 500 of the word line voltage generator 202 have gate oxide films that are thicker than that of the access transistor 101 that makes up the memory cell, so that the reliability of the word line voltage generator 202 to which a high voltage is applied can be ensured.

In addition, the transistors used in the word line drive circuit 200 have gate oxide films that are thicker than that of the access transistor 101, so that the reliability of the word line drive circuit 200 to which a high voltage is applied can be ensured.

Second Embodiment

Figure 13:
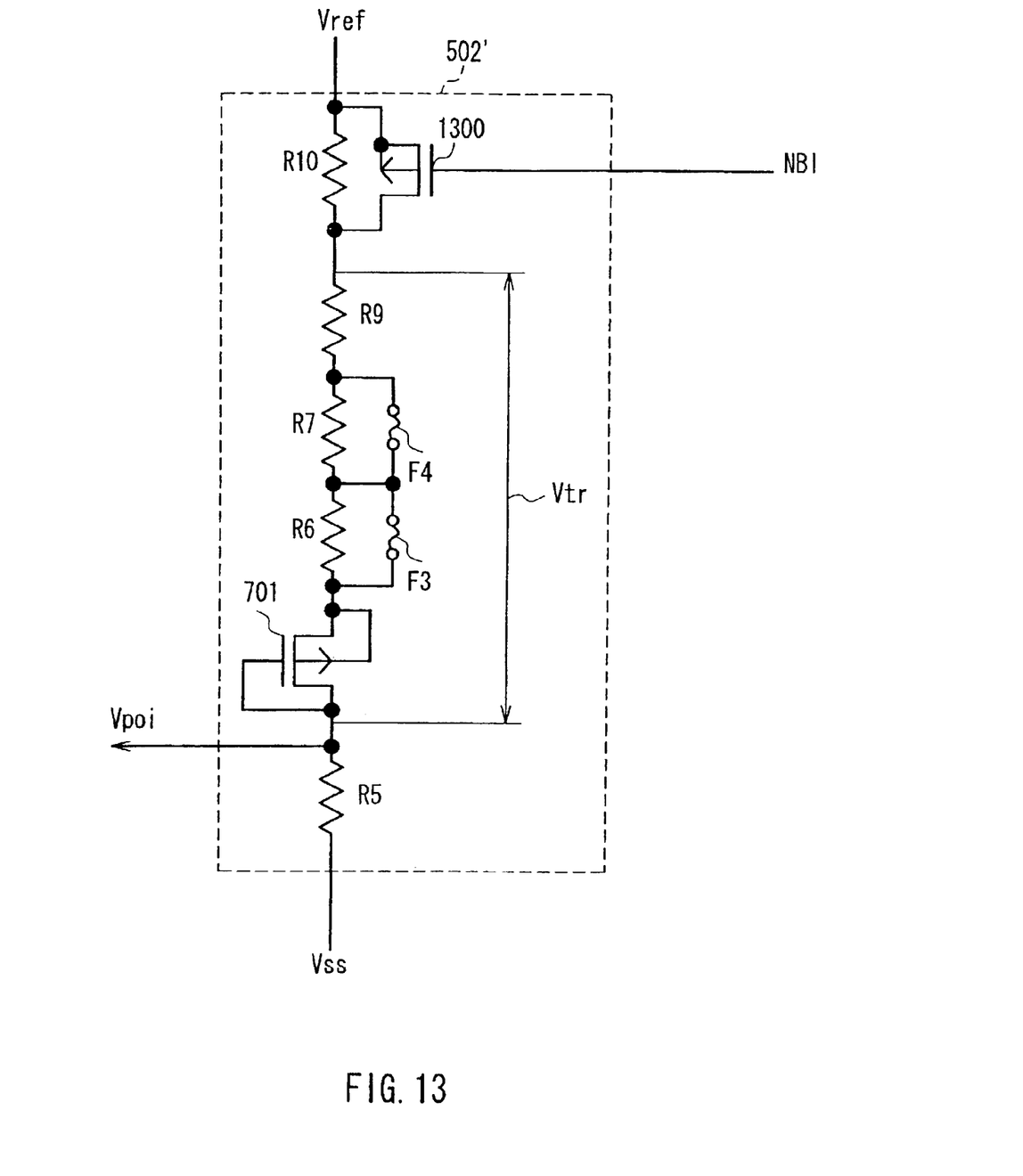
FIG. 13 is a circuit diagram showing the internal configuration of the offset load 502' of the semiconductor memory device according to a second embodiment of the present invention.

Next, a second embodiment of the present invention will be described. The present embodiment differs from the first embodiment in the configuration of the offset load in the word line voltage generator 202.

FIG. 13 is a circuit diagram showing the internal configuration of the offset load 502' in the semiconductor memory device according to the second embodiment of the present invention. In FIG. 13, R9, and R10 denote resistive elements, numeral 1300 denotes a p-channel transistor, and NBI denotes a burn-in signal. Elements identical to those of FIG. 7, which shows the configuration of the offset load 502 according to the first embodiment, are assigned identical reference numerals, and further description thereof is omitted.

In FIG. 13, the offset load 502' according to the present embodiment differs from the offset load 502 according to the first embodiment shown in FIG. 7 in that the resistive element R8 is divided into two resistive elements R9 and R10 connected in series and the p-channel transistor 1300 is connected in parallel with the resistive element R10. The first reference voltage Vref is supplied to one end of the resistive element R10 and the source and the substrate of the p-channel transistor 1300, and the other end of resistive element R10 is connected to the drain of the p-channel transistor 1300 and one end of the resistive element R9. Further, a burn-in signal NBI is applied to the gate of the p-channel transistor 1300.

Next, the operation of the offset load 502' according to the present embodiment will be described.

The burn-in signal NBI is at a low level when a burn-in test is conducted and is at a high level during normal operation'. The burn-in signal NBI is at a high level during normal operation, so that the p-channel transistor 1300 is off, and the same voltage as in the first embodiment is generated as the first reference voltage Vref When the burn-in test is conducted, the burn-in signal NBI is at a low level, the p-channel transistor 1300 is turned on, and a lower voltage than that in the first embodiment is generated as the first reference voltage Vref As mentioned above, according to the present embodiment, the first reference voltage Vref can be lowered when the burn-in test is conducted, that is, an off-state voltage of the word line WL can be lowered. This configuration makes it possible to prevent an unnecessarily high voltage from being applied to the word line WL, even if a high voltage is applied as an external power source voltage Vdd when the burn-in test is conducted.

As described above, according to the present invention, the external power source Vdd3, whose voltage is higher than that of the external power source Vdd supplied to the memory cell, is supplied to the word line voltage generator, and the reference voltage generating circuit generates a voltage that is higher, by the voltage generated through the diode connection of the p-channel transistor, than the voltage proportional to the external power source Vdd, so that a channel leakage current when the memory cell is off can be reduced most efficiently over a wide range of external voltages Vdd, and a semiconductor device having a comparatively small circuit area can be achieved.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device comprising:
a plurality of dynamic random access memory cells, each having an access transistor whose drain is connected to a bit line, whose gate is connected to one of a plurality of word lines, and whose source is connected to a capacitive element;
a plurality of word line drive circuits that are connected to the plurality of word lines; and
a word line voltage generator that is connected to the plurality of word line drive circuits;
wherein a first power source that is supplied externally is supplied to a sense amplifier for driving the bit line, the word line voltage generator receives the first power source and a second power source that is supplied externally, generates a voltage that is by a predetermined voltage closer to a voltage of the second power source than the voltage of the first power source, and supplies the generated voltage to the plurality of word line drive circuits as a word line drive voltage.

2. The semiconductor memory device according to claim 1, wherein the word line voltage generator comprises:
a first comparator for comparing the word line drive voltage that is supplied to the word line drive circuit with a first reference voltage, and controlling conduction between a signal line of the word line drive voltage and the second power source;
a first reference voltage generating circuit for generating a voltage proportional to the voltage of the first power source as a second reference voltage;
a second reference voltage generating circuit for generating a third reference voltage from a second node that is connected through a transistor that is diode-connected to a first node to which the first reference voltage is applied; and
a second comparator for determining the first reference voltage by comparing the second reference voltage and the third reference voltage.

3. The semiconductor memory device according to claim 2, wherein the voltage of the first power source has positive polarity, and the voltage of the second power source is higher than the voltage of the first power source.

4. The semiconductor memory device according to claim 3, wherein the first reference voltage generating circuit generates the second reference voltage by resistively dividing a voltage between the first power source and ground, and the second reference voltage generating circuit comprises: a first resistive element that is connected in series with the transistor that is diode-connected between the first node and the second node; and a second resistive element that is connected between the second node and the ground, and generates the third reference voltage based on a voltage that is generated across the second resistive element.

5. The semiconductor memory device according to claim 3, wherein the access transistor is a p-channel transistor.

6. The semiconductor memory device according to claim 2, wherein the film thickness of a gate oxide film of transistors constituting the first and the second comparators is larger than that of a gate oxide film of the access transistor.

7. The semiconductor memory device according to claim 2, wherein the semiconductor memory device is formed with a logic circuit on a single semiconductor chip, the semiconductor chip includes a plurality of input/output portions (I/O) that are used for connection with the outside, and a power source that is supplied to the plurality of I/Os is shared with the second power source.

8. The semiconductor memory device according to claim 2, wherein the semiconductor memory device is formed with an analog circuit on a single semiconductor chip, and a power source that is supplied to the analog circuit is shared with the second power source.

9. The semiconductor memory device according to claim 7, wherein the film thickness of the gate oxide film of the transistors constituting the first and the second comparators is larger than that of the gate oxide film of the access transistor, and the gate oxide film of the transistors that constitute the first and the second comparators is manufactured in the same manufacturing step as a gate oxide film of transistors that constitute the plurality of I/Os.

10. The semiconductor memory device according to claim 8, wherein the film thickness of the gate oxide film of the transistors that constitute the first and the second comparators is larger than that of the gate oxide film of the access transistor, and the gate oxide film of the transistors that constitute the first and the second comparators is manufactured in the same manufacturing step as a gate oxide film of transistors that constitute the analog circuit.

11. The semiconductor memory device according to claim 6, wherein a gate oxide film of transistors that constitute the plurality of word line drive circuits is manufactured in the same manufacturing step as the gate oxide film of the transistors that constitute the first and the second comparators.

12. The semiconductor memory device according to claim 7, wherein the gate oxide film of the transistors that constitute the plurality of word line drive circuits is manufactured in the same manufacturing step as the gate oxide film of the transistors that constitute the first and the second comparators and the gate oxide film of the transistors that constitute the plurality of I/Os.

13. The semiconductor memory device according to claim 8, wherein the gate oxide film of the transistors that constitute the plurality of word line drive circuits is manufactured in the same manufacturing step as the gate film of the transistors that constitute the first and the second comparator and the gate oxide film of the transistors that constitute the analog circuit.

14. The semiconductor memory device according to claim 5, wherein capacitive elements of the plurality of dynamic random access memory cells are made of second p-channel transistors.

15. The semiconductor memory device according to claim 11, wherein the semiconductor memory device is manufactured by a general logic process.

16. The semiconductor memory device according to claim 2, wherein the word line drive voltage is higher by approximately 0.4V than the voltage of the first power source.

17. The semiconductor memory device according to claim 5, wherein the diode-connected transistor is a p-channel transistor having the same configuration as the access transistor, and the word line drive voltage is higher than a voltage proportional to the voltage of the first power source by a voltage generated through the diode connection of the diode-connected level.

18. The semiconductor memory device according to claim 1, wherein the world line voltage generator generates a voltage obtained by adding a first offset voltage to the voltage of the first power source when a control signal that is input is at a first voltage level, and generates a voltage obtained by adding a second offset voltage that is lower than the first offset voltage to the voltage of the first power source when the control signal is at a second voltage level.

* * * * *